United States Patent
Hankes

(10) Patent No.: US 9,496,160 B2
(45) Date of Patent: Nov. 15, 2016

(54) WORKPIECE ORIENTING AND CENTERING WITH A FACTORY INTERFACE

(71) Applicant: APPLIED MATERIALS, INC., Santa Clara, CA (US)

(72) Inventor: Michael Carl Hankes, Austin, TX (US)

(73) Assignee: APPLIED MATERIALS, INC., Santa Clara, CA (US)

(*) Notice: Subject to any disclaimer, the term of this patent is extended or adjusted under 35 U.S.C. 154(b) by 402 days.

(21) Appl. No.: 14/050,795

(22) Filed: Oct. 10, 2013

(65) Prior Publication Data

US 2015/0056043 A1    Feb. 26, 2015

Related U.S. Application Data

(60) Provisional application No. 61/868,182, filed on Aug. 21, 2013.

(51) Int. Cl.
*H01L 21/67* (2006.01)
*H01L 21/677* (2006.01)
*H01L 21/68* (2006.01)

(52) U.S. Cl.
CPC ... *H01L 21/67201* (2013.01); *H01L 21/67748* (2013.01); *H01L 21/681* (2013.01)

(58) Field of Classification Search
CPC ............... H01L 21/67276; H01L 21/67201; H01L 21/67748; H01L 21/681; G05B 2219/45031; G05B 19/4189
USPC .......................................................... 700/112
See application file for complete search history.

(56) References Cited

U.S. PATENT DOCUMENTS

| 5,690,744 | A | | 11/1997 | Landau | |
|---|---|---|---|---|---|
| 5,742,393 | A | | 4/1998 | Landau et al. | |
| 5,905,850 | A | * | 5/1999 | Kaveh | H01L 21/67259 198/394 |
| 6,120,601 | A | | 9/2000 | Landau et al. | |
| 6,399,957 | B1 | * | 6/2002 | Murata | G01N 21/9501 250/559.4 |
| 6,466,838 | B1 | * | 10/2002 | Aoki | G03F 7/70691 700/121 |
| 6,934,606 | B1 | * | 8/2005 | Genetti | H01L 21/67201 118/712 |
| 2002/0172423 | A1 | * | 11/2002 | Prakash | H04N 1/00002 382/192 |
| 2011/0200247 | A1 | * | 8/2011 | Ravid | G06K 9/3275 382/144 |

* cited by examiner

Primary Examiner — Robert Fennema
Assistant Examiner — Jigneshkumar Patel
(74) *Attorney, Agent, or Firm* — Robert M. Wallace

(57) ABSTRACT

A workpiece orientation is determined by camera during transfer to a load lock, and the orientation is corrected during load lock pump down.

4 Claims, 4 Drawing Sheets

WORKPIECE ORIENTING AND CENTERING WITH A FACTORY INTERFACE

CROSS-REFERENCE TO RELATED APPLICATIONS

This application claims the benefit of U.S. Provisional Application Ser. No. 61/868,182 filed Aug. 21, 2013 entitled WORKPIECE ORIENTING AND CENTERING WITH A FACTORY INTERFACE, by Michael Carl Hankes.

BACKGROUND

1. Technical Field

The disclosure concerns centering and rotationally orienting a workpiece, such as a semiconductor wafer, in a factory interface.

2. Background Discussion

A workpiece such as a semiconductor wafer is transported to a workpiece support in a tool such as a reactor chamber or process chamber, using a factory interface. The factory interface has at least one load port for receiving a workpiece to be processed and a load lock providing a transition between the atmospheric environment of the factory interface and the vacuum environment of the tool or process chamber. Workpieces are transported within the factory interface between the load port and the load lock by a factory interface (FI) robot. The workpiece must be oriented correctly (by rotation) before it is transferred to the tool or process chamber. This requires an aligner (or "orienter") within the factory interface to rotate the workpiece to the orientation required by the tool or process chamber. For this purpose, the FI robot grabs a workpiece to be processed from the load port and places it on the aligner in the factory interface, and then releases the workpiece. The aligner may use a standard notch on the workpiece edge to orient the workpiece. The term orientation or orientation of the workpiece refers to a rotational position of the workpiece about a central axis of symmetry of the workpiece.

After the aligner has oriented the workpiece, the FI robot grabs the workpiece, lifts it from the aligner and transports it to the load lock, where it releases the workpiece. A vacuum robot in the load lock then transports the workpiece to the workpiece support stage of the tool or process chamber.

One problem is that the aligner takes about four seconds to properly align each workpiece. This imposes a significant limitation on productivity or throughput. Another problem is that the FI robot must handle (by either grabbing or releasing) each workpiece four times, in accordance with the foregoing description in which it delivers the workpiece first to the aligner and then to the load lock. With the current reductions in workpiece (wafer) thickness, and with circuit structures using more of the workpiece surface and thereby pushing integrated circuit features closer to the workpiece edge, thin film structures at the workpiece edge are more susceptible to damage from repeated handling by the FI robot. The repeated handling by the FI robot involves greater risk of damage to thin film structures on the workpiece.

SUMMARY

A workpiece transfer system comprises a load apparatus (a factory interface) comprising a load port. The system further comprises a load lock and a first (factory interface) robot for workpiece transfer along a path between the load port and the load lock. The load lock comprises a first opening adjacent or facing the load apparatus, a second opening adjacent or facing the process chamber, a rotatable platform and a second (vacuum transfer) robot for workpiece transfer between the rotatable workpiece support and the process chamber opening. The system further comprises a camera having a field of view extending across the path between the load port and the load lock, for workpiece image capture, an image processor adapted to determine a workpiece orientation from a workpiece image captured by the camera, and a controller comprising a controller output coupled to the rotatable stage.

In embodiments, the controller is adapted to govern the rotatable stage in accordance with the workpiece orientation and a predetermined workpiece orientation.

In one embodiment, the image processor is adapted to determine a workpiece center location from the workpiece image captured by the camera, and the controller is adapted to govern the factory interface robot in accordance with the workpiece center location.

In embodiments, the field of view has a long dimension transverse to the direction of the path corresponding to a diameter of the workpiece and short dimension along the direction of the path that is less than the long dimension.

In a related embodiment, the camera is adapted to capture multiple frames during transfer of the workpiece to the load lock, the multiple frames corresponding to the workpiece image captured by the camera. In an embodiment, the field of view corresponds to an array of pixels, and the short dimension corresponds to a length of between one and twenty pixels.

In one embodiment, the load lock further comprises a first vacuum sealable door at the factory interface opening and a second vacuum sealable door at the process chamber opening. The controller may be adapted to control the opening and closing of the first and second vacuum sealable doors.

In a related embodiment, the system further comprises a process chamber in communication with the process chamber opening of the load lock and a vacuum pump coupled to the load lock, the controller connected to govern the vacuum pump.

A method is provided for handling a workpiece using a factory interface, comprising (a) transferring by a factory interface robot a workpiece from a load port to stage in a load lock of the factory interface, (b) capturing an image of the workpiece near an entrance to the load lock during the transferring, (c) determining from the image an orientation of the workpiece relative to the factory interface robot, (d) pumping down a pressure within the load lock from an ambient pressure to a process chamber pressure (e) during the pumping down, rotating the stage to change the orientation of the workpiece to a desired orientation, and (f) after the pumping down, transporting the workpiece from the stage of the load lock to a process chamber.

The method may further comprise determining from the image a location of a center of the workpiece relative to the factory interface robot, and during the transferring, aligning the center of the workpiece with a center of the stage.

In one embodiment of the method, the load lock comprises a first vacuum sealable door openable to the factory interface and a second vacuum sealable door openable to the process chamber, the transferring follows a workpiece transfer path through an opening of the first vacuum sealable door, and the transporting follows a workpiece transfer path through an opening of the second vacuum sealable door.

In one embodiment, the method further comprises closing the first vacuum sealable door upon completion of the transferring and prior to the pumping down, and opening the second vacuum sealable door upon completion of the pumping down.

In one embodiment, the capturing an image comprises defining a field of view traversing a workpiece transfer path of the factory interface robot, capturing successive image slices of the workpiece in the field of view during motion of the workpiece along the path, and combining the image slices to form a mosaic image of the workpiece.

In one embodiment, the determining an orientation comprises inferring an angular orientation of a predetermined feature on the workpiece. The predetermined feature may comprise a notch in an edge of the workpiece.

In accordance with another aspect, a method of handling a workpiece comprises: (a) transferring the workpiece along a transfer path to the interior of a load lock, (b) during the transferring, capturing an image of the workpiece, (c) determining from the image an orientation of the workpiece relative to a frame of reference, (d) after the transferring, pumping down an interior pressure of the load lock to a process chamber pressure, (e) during the pumping down, rotating the workpiece to change the orientation to a desired orientation, and (f) after the pump down, transferring the workpiece to a process chamber.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
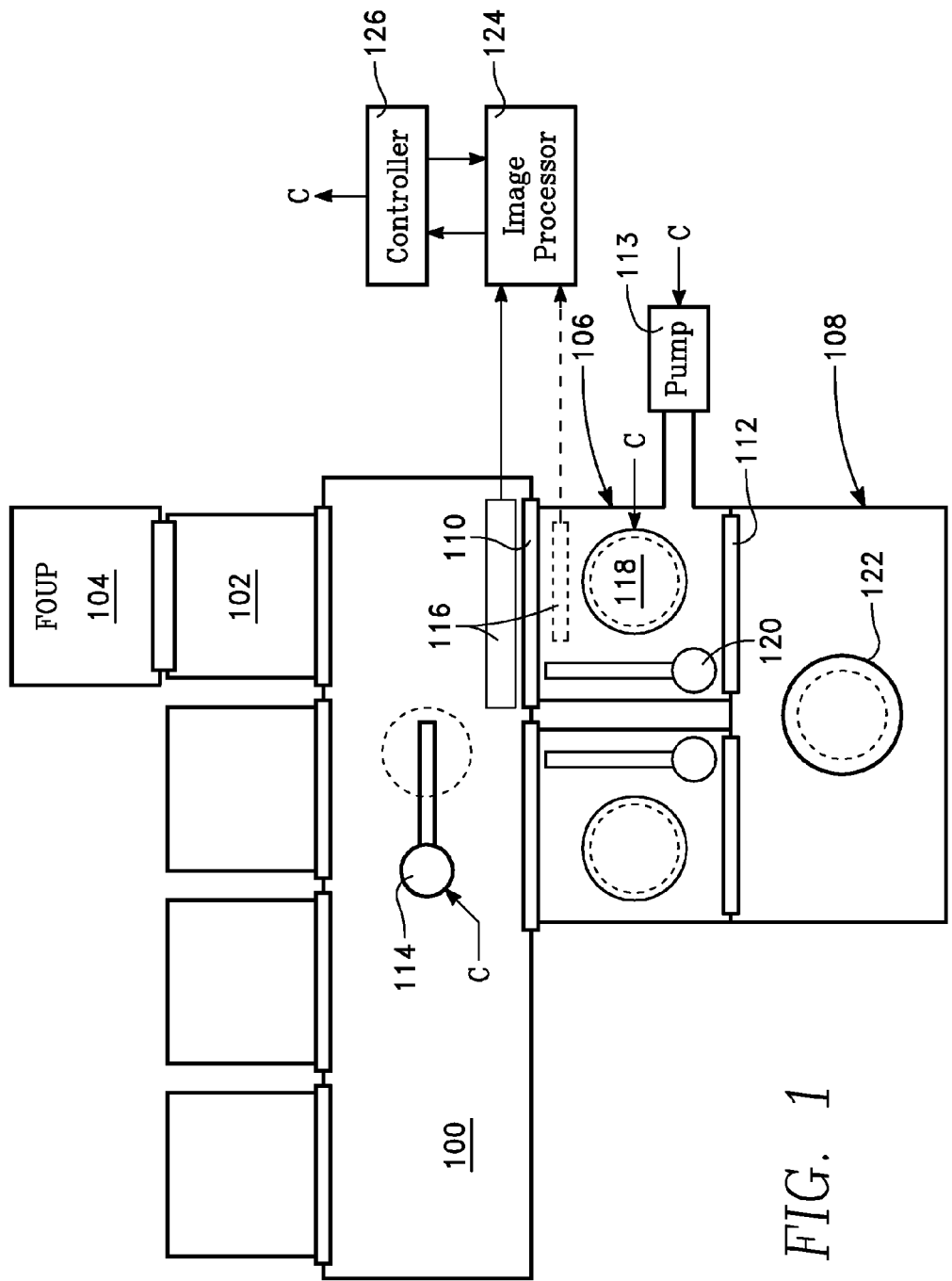
FIG. 1 is a simplified top view of a wafer handling system in accordance with one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 2:
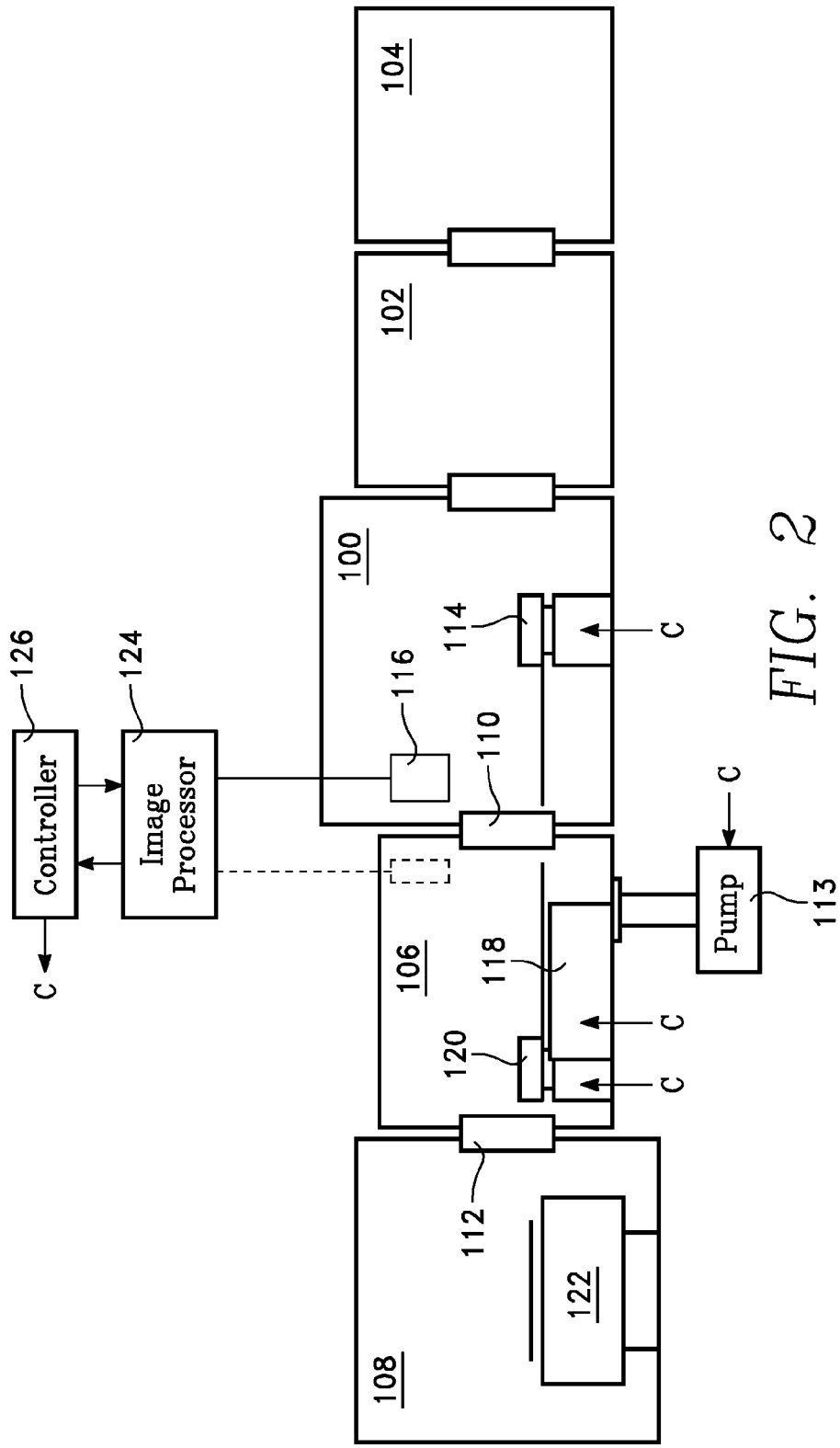
FIG. 2 is an elevational view corresponding to FIG. 1.

Referring to FIGS. 1 and 2, a system for handing workpieces such as semiconductor wafers includes a factory interface 100. Hereinafter, the workpiece is referred to as a wafer, although it may be a photolithographic mask, a plasma display, a solar cell array or other device. On a receiving side of the factory interface 100, a load port 102 is provided. As depicted in the drawings, more than one load port may be provided. The load port 102 is adapted to receive from a conventional front opening unified pod ("FOUP") 104 a wafer which is to be processed. On a delivery side of the factory interface 100, a load lock 106 is coupled to a process chamber 108. As depicted in the drawings, more than one load lock may be provided. The process chamber 108 may be capable of performing a particular process, such as plasma enhanced reactive ion etching, plasma enhanced chemical vapor deposition, physical vapor deposition, ion implantation, dynamic surface annealing or other suitable process. The load lock 106 provides a transition between the atmospheric pressure of the factory interface 100 and the vacuum pressure of the process chamber 108. The load lock 106 has one vacuum sealable door 110 which opens to the factory interface 100 and another vacuum sealable door 112 which opens to the process chamber 108. A vacuum pump 113 is coupled to the load lock 106, for pumping down the load lock internal pressure after the vacuum sealable doors 110 and 112 are closed, as will be described below. A factory interface robot (FI robot) 114 transports wafers from the load port 102 to the load lock 106. A camera 116 is positioned above the entrance to each load lock 106 and has a field of view including a portion of the path followed by the wafer while entering the load lock 106. In the illustrated embodiment, the camera 116 is on the load lock side of the entrance, but in other embodiments the camera 116 may be inside the load lock 106, as indicated in dashed line in FIG. 1.

The load lock 106 has a rotatable stage 118 for holding a wafer inside the load lock 106. The FI robot 114 places each wafer on the rotatable stage 118 upon delivery to the load lock 106. A vacuum robot 120 inside the load lock 106 transports the wafer from the rotatable stage 118 of the load lock 106 to a wafer support 122 in the process chamber 108.

An image processor 124 is connected to the camera 116 and a controller 126 is connected to the image processor 124. The camera 116 provides an image of the wafer during transport of the wafer into the load lock 106. The controller 126 governs the placement of the wafer on the rotatable stage 118 in response to data from the image processor 124 defining the location of the wafer center, so as to center the wafer on the rotatable stage 118. In one embodiment, the data from the image processor 124 defines the location of the center of the wafer relative to the FI robot 114, so that the controller 126 can have the FI robot 114 align the wafer center with the center of the rotatable stage 118. The controller 126 governs the rotation of the rotatable stage 118 during pump down of the load lock 106 in response to data from the image processor 124 defining the angular orientation of the wafer, so as orient the wafer at the angle required by the process chamber 108.

Figure 3A:
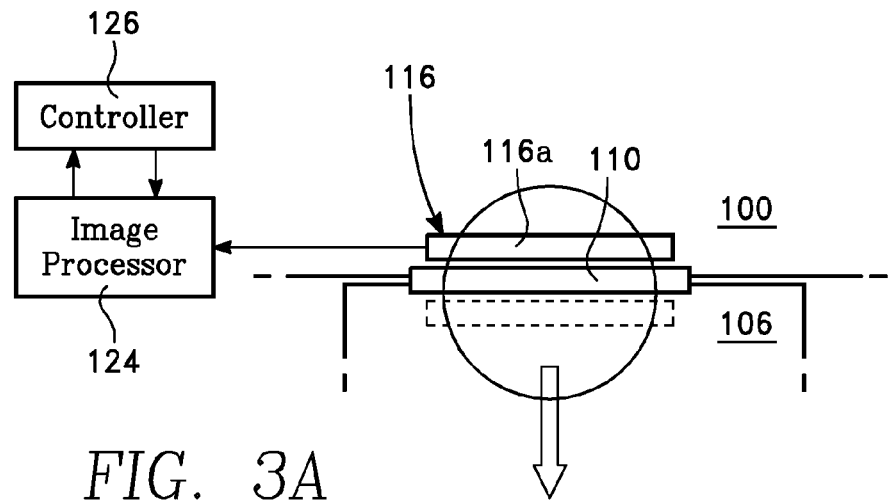
FIG. 3A is a simplified diagram depicting image capture in an embodiment.
Figure 3B:
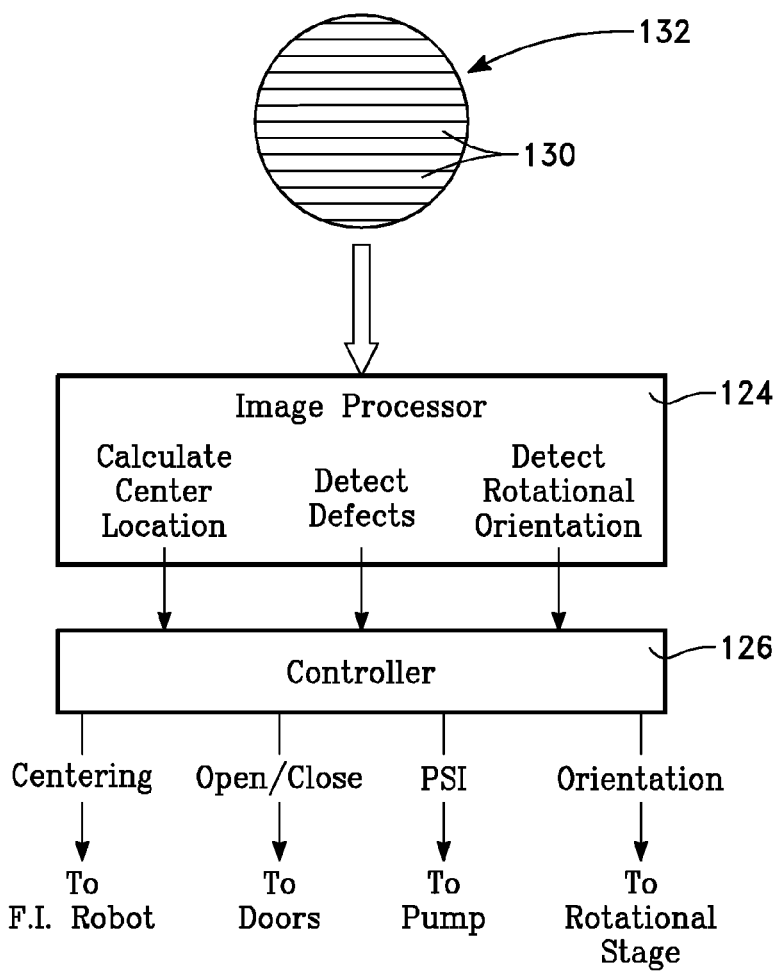
FIG. 3B is a simplified block diagram depicting image processing and control.

Referring to FIGS. 3A and 3B, the camera 116 in one embodiment has a thin field of view 116a having a short dimension along the direction of wafer transport and long dimension corresponding to the wafer diameter. The camera 116 captures successive slice-like image frames 130 that together form a mosaic image 132 of the entire wafer surface. The camera 116 in one embodiment may be a digital camera and the field of view 116a may correspond to an array of picture elements (i.e., pixels). The long dimension may be thousands of pixels while the short dimension may be a minimal number, e.g., between one and twenty pixels.

The image processor 124 computes, from the wafer image, the location of the wafer center, the angular orientation of the wafer, and senses (in the image) defects near the wafer edge. The angular orientation may be determined from the orientation of a notch on the wafer edge, for example. Alternatively, the wafer orientation may be determined from orientation of thin film structures on the wafer. The wafer center location and the angular orientation may be determined relative to a frame of reference, such as coordinates of the FI robot 114 or coordinates of the factory interface 100.

During placement by the FI robot 114 of the wafer onto the rotatable stage 118, the controller 126 uses the location of the wafer center to center the wafer on the rotatable stage 118. Prior to sealing the load lock 106, the controller 126 determines whether the defect count or defect density exceeds a predetermined threshold, and, if so, withdraws the wafer from load lock 106, from which it may be returned to the load port 102 or other suitable place. After the wafer is placed in the load lock 106, the vacuum sealable doors 110 and 112 are closed and the interior pressure of the load lock 106 is pumped down by the vacuum pump 113 under control of the controller 126 to match the vacuum pressure in the process chamber 108. During pump down of the load lock 106, the controller 126 causes the rotatable stage 118 to rotate the wafer to the required orientation, based upon the wafer orientation information from the image processor 124. Thereafter, the vacuum robot 120 transfers the wafer from the load lock 106 to the process chamber 108.

An advantage is that the step of correctly orienting the wafer adds no additional time to the wafer handling and wafer transfer process, because it is performed during the mandatory pump down time of the load lock 106. This contrasts with the conventional practice in which the orienting of each wafer adds four seconds of time to the wafer handling and transfer process. Another advantage is that the wafer is handled by the FI robot 114 only twice, as opposed to four times in conventional practice, thus reducing the chance of damage from robot handling by a factor of two.

Figure 4:
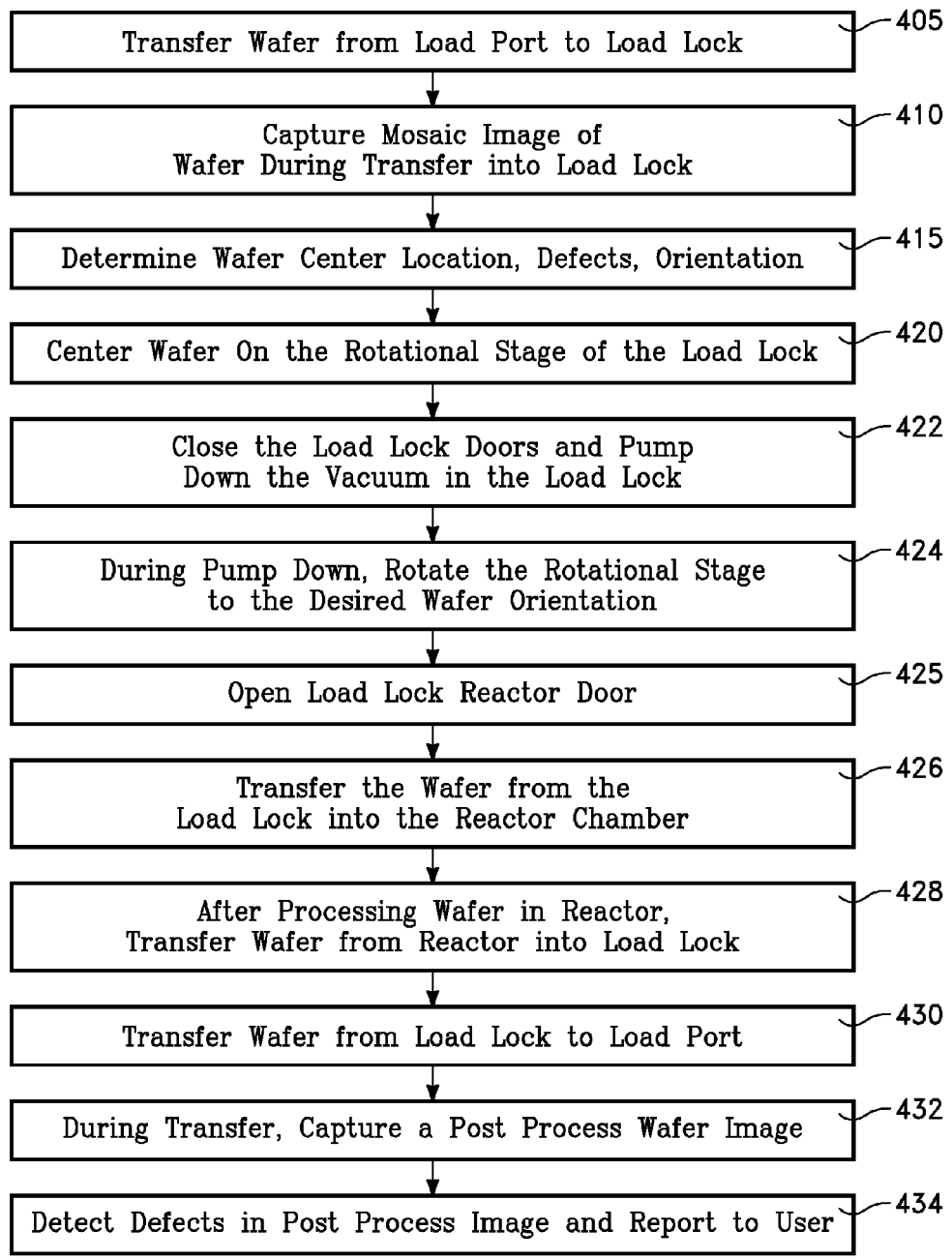
FIG. 4 is a block diagram of a method of operating the system of FIG. 1.

A method of operating the system of FIGS. 1 and 2 is depicted in FIG. 4. Referring to FIG. 4, the FI robot 114 transfers an incoming wafer from the load port 102 to the load lock 106 and places it on the rotatable stage 118 (block 405 of FIG. 4). Simultaneously, during transfer of the wafer to the load lock 106, the camera 116 captures a mosaic image of the entire wafer (block 410 of FIG. 4). The image processor 124 then determines from the wafer image: (a) the location of the center of the wafer, (b) the angular orientation of the wafer, and optionally (c) defect density at the wafer edge (block 415 of FIG. 4). In one embodiment, if the defect density exceeds a predetermined threshold, the controller 126 causes the FI robot 114 to withdraw the wafer from the load lock 106, and may flag this condition to a user or control interface.

During placement of the wafer on the rotatable stage 118 of block 405, the controller 126 has the FI robot 114 place the center of the wafer on the center of the rotatable stage 118 (block 420 of FIG. 4). The FI robot 114 withdraws from the load lock 106, leaving the wafer on the rotatable stage 118, and the controller 126 closes the vacuum sealable doors 110 and 112, and enables the vacuum pump 113 to pump down the load lock 106 (block 422 of FIG. 4). During the pump down time of block 422, the controller 126 causes the rotatable stage 118 to correct the orientation of the wafer in accordance with the angular orientation of the wafer previously determined by the image processor 124 (block 424 of FIG. 4). At this point, the wafer has been centered and correctly oriented and is ready for introduction into the process chamber 108. The controller 126 opens the vacuum sealable door 112 leading to the process chamber 108 (block 425 of FIG. 4) and commands the vacuum robot 120 to transfer the wafer to the process chamber 108 (block 426 of FIG. 4). The wafer is then processed in the process chamber 108. Upon completion of processing, the controller 126 opens the vacuum sealable door 112 and has the vacuum robot 120 remove the wafer from the process chamber 108 to the load lock 106 (block 428 of FIG. 4). The controller 126 may then close the vacuum sealable door 112. Then, the controller 126 has the FI robot 114 transfer the wafer from the load lock 106 to the load port 102 (block 430 of FIG. 4), and during this transfer the camera captures a post-processing image of the wafer (block 432 of FIG. 4). The image processor 124 processes the post-processing wafer image to detect defects on the wafer, and issues a notice to the controller 126 (and/or to a user interface for example) if the defect density exceeds a predetermined threshold (block 434 of FIG. 4).

While the foregoing is directed to embodiments of the present invention, other and further embodiments of the invention may be devised without departing from the basic scope thereof, and the scope thereof is determined by the claims that follow.

What is claimed is:
1. A method of handling a workpiece, comprising:
transferring a workpiece from a load port to a rotatable platform in a load lock;
capturing an image of the workpiece near an entrance to said load lock during said transferring;
determining from said image an orientation of the workpiece relative to a frame of reference;
pumping down a pressure within said load lock from an ambient pressure to a reactor chamber pressure;
during said pumping down, rotating said rotatable platform to change the orientation of said workpiece to a desired orientation;
after said pumping down, transporting said workpiece from said rotatable platform of said load lock to a processing chamber;
determining from said image a location of a center of said workpiece relative to said frame of reference; and
during said transferring, aligning the center of said workpiece with a center of said rotatable platform;
wherein said load lock comprises a first vacuum sealable door, and a second vacuum sealable door openable to the processing chamber;
wherein said transferring follows a workpiece transfer path through an opening of said first vacuum sealable door and said transporting follows a workpiece transfer path through an opening of said second vacuum sealable door;
closing said first vacuum sealable door upon completion of said transferring and prior to said pumping down; and
opening said second vacuum sealable door upon completion of said pumping down;
determining from said image a defect measurement corresponding to a defect count or defect density; and
if said defect measurement exceeds a predetermined threshold, withdrawing said workpiece away from said load lock prior to closing said first vacuum sealable door.

2. The method of claim 1 wherein said transferring is performed along a path, and wherein said capturing an image comprises:
defining a field of view transverse to said path;
capturing successive image slices of the workpiece in said field of view during motion of said workpiece along said path; and
combining said image slices to form a mosaic image of said workpiece.

3. The method of claim 1 wherein said determining an orientation comprises inferring an angular orientation of a predetermined feature on said workpiece.

4. The method of claim 3 wherein said predetermined feature comprises a notch in an edge of said workpiece.

\* \* \* \* \*